US007910865B2

(12) United States Patent
Haag et al.

(10) Patent No.: US 7,910,865 B2
(45) Date of Patent: Mar. 22, 2011

(54) METHOD AND ARRANGEMENT FOR SUPPLYING POWER TO SEVERAL INDUCTION COILS IN AN INDUCTION APPARATUS

(75) Inventors: Thomas Haag, Oberhausen-Rheinhausen (DE); Jörg Bögel, Oberderdingen (DE); Hartmut Friedrich, Bretten-Ruit (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 423 days.

(21) Appl. No.: 11/934,480

(22) Filed: Nov. 2, 2007

(65) Prior Publication Data

US 2008/0087661 A1 Apr. 17, 2008

Related U.S. Application Data

(63) Continuation of application No. PCT/EP2006/004081, filed on May 2, 2006.

(30) Foreign Application Priority Data

May 4, 2005 (DE) ........................ 10 2005 021 888

(51) Int. Cl.
*H05B 6/12* (2006.01)
*H05B 6/04* (2006.01)
*H05B 6/36* (2006.01)
*C23C 16/00* (2006.01)

(52) U.S. Cl. ................ 219/620; 118/723 I; 118/723 IR; 219/661; 219/672

(58) Field of Classification Search ............... 219/10.77, 219/10.49 R, 620–627, 661–667, 672–676; 118/723 I, 723 IR, 724, 725
See application file for complete search history.

(56) References Cited

U.S. PATENT DOCUMENTS

| | | | | |
|---|---|---|---|---|
| 4,112,287 | A * | 9/1978 | Oates et al. | 219/626 |
| 4,542,273 | A | 9/1985 | Hirata | |
| 4,564,733 | A * | 1/1986 | Karklys | 219/622 |
| 6,498,325 | B1 | 12/2002 | Akel et al. | |
| 6,528,770 | B1 * | 3/2003 | Akel et al. | 219/624 |
| 2007/0135037 | A1 * | 6/2007 | Barragan Perez et al. | 455/7 |

FOREIGN PATENT DOCUMENTS

DE 198 13996 10/1999

OTHER PUBLICATIONS

ES2201937-A1.pdf machine translation.*
German Search Report from German Application No. 10 2005 021 888.1.
International Search Report from PCT/EP2006/004081 dated Aug. 24, 2006.

* cited by examiner

*Primary Examiner* — Stephen J Ralis
*Assistant Examiner* — Ket D Dang
(74) *Attorney, Agent, or Firm* — Alston & Bird LLP

(57) ABSTRACT

An arrangement for controlling induction coils of an induction cooking hob so as to minimize noise production resulting from intermodulation of certain frequencies of operation. The induction coils are operated in two modes, with a first mode at the same frequency $f_g$ so to produce a low intermodulation or differential frequency, or at a second mode having a high differential frequency of about 18 kHz. Alternating back and forth between said modes of operation makes it possible to reach predefined average values for the power of the induction coils for a given time period, while at the same time minimizing development of disturbing noise.

15 Claims, 3 Drawing Sheets

METHOD AND ARRANGEMENT FOR SUPPLYING POWER TO SEVERAL INDUCTION COILS IN AN INDUCTION APPARATUS

CROSS REFERENCE TO RELATED APPLICATIONS

This application is a continuation of PCT/EP2006/004081, filed May 2, 2006, which in turn claims priority to DE 10 2005 021 888.1, filed on May 4, 2005, the contents of both of which are incorporated by reference.

FIELD OF INVENTION

The invention relates to a method for supplying power to several induction coils in an induction apparatus and an arrangement for performing this method.

BACKGROUND OF THE INVENTION

A problem frequently arises in the case of induction hobs or cooktops, in which audible noises can arise when operating several hotplates. In part, these noises are considered to be unpleasant to an operator, not only as a result of the noise per se, but also because it may imply to the operator that an induction hob is malfunctioning. The sensation of noise is also dependent on the sound level intensity and the coincidence with the human audible frequency range, i.e., as a function of the frequency of the noise.

There are various causes of such noise. First, magnetic field control ferrites are provided underneath the induction coils, which are subject to magnetostriction, i.e., a change in length as a function of the induction coil operating frequency. This, in part, may also apply to the cooking utensils used. Although the operating frequency of induction coils is normally above the audible range, the noise can be audible as a result of intermodulation with another operateing induction coil. Audible mixture sound can arise from the frequency difference of the operating frequencies and their harmonic waves. Further, intermodulations can occur if two frequency converters for the induction coils are connected to a common supply voltage. In this case, the supply voltage for a second frequency converter is modulated by the first frequency converter.

BRIEF DESCRIPTION OF THE DRAWINGS

An embodiment of the invention is described hereinafter relative to the diagrammatic drawings, wherein.

DETAILED DESCRIPTION

Figure 1:
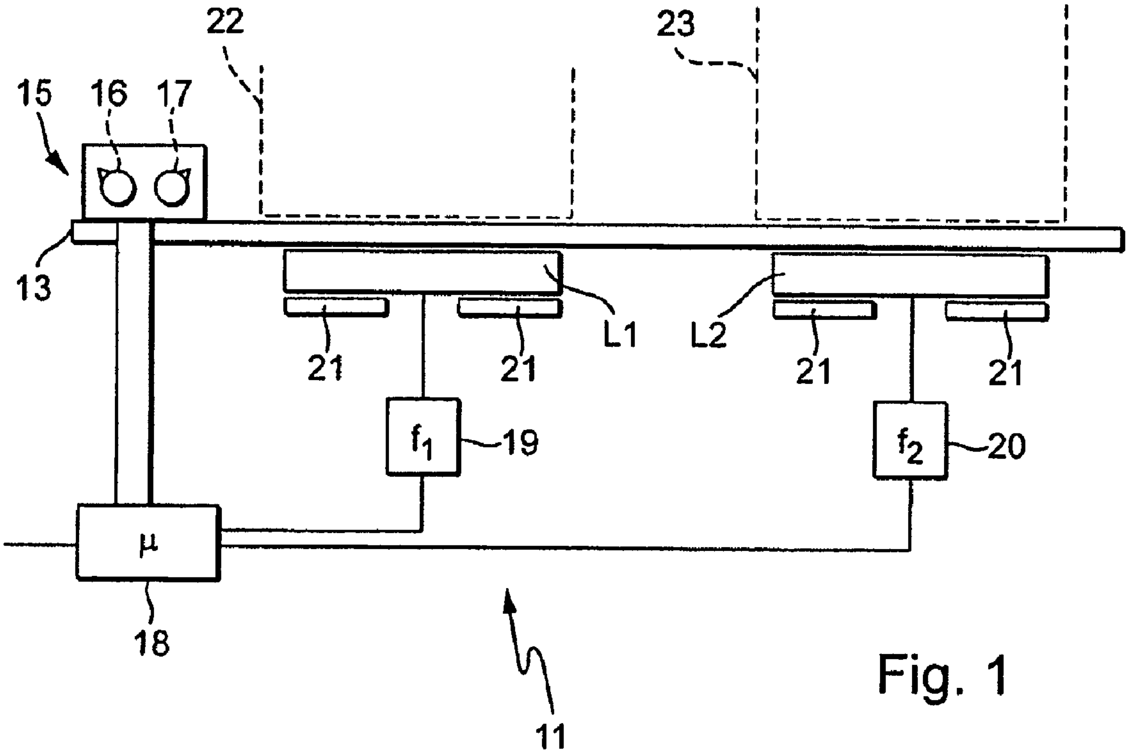
FIG. 1 illustrates a circuit diagram of an arrangement of two induction coils in an induction hob with in each case a frequency converter.

A problem addressed by the invention is to provide a method and an arrangement with which the prior part problems can be avoided and where an advantageous operation of several induction coils with minimum noise evolution is possible.

This problem is solved in one embodiment by a method having the features of claim 1 and an arrangement having the features of claim 9. Advantageous and preferred embodiments of the invention form the subject matter of the further claims and are explained in greater detail hereinafter. By express reference the wording of the claims is made into part of the content of the description.

By means of its own frequency converter or its own frequency converter unit, each induction coil is supplied with power. According to one embodiment of the invention, as in the case of the simultaneous operation of several induction coils, the operating frequencies or the frequencies of the frequency converters for the individual induction coils are set as a function of a given power level or by an operator by inputting the necessary power values with respect to a difference between the frequencies, i.e. a frequency difference, according to one of the following possible operating modes:

a) the frequency difference is virtually zero and is advantageously zero, b) the frequency difference is less than 1 kHz, i.e. although advantageously present, it is relatively small, and c) the frequency difference is between 15 kHz and 25 kHz and is no longer in the audible range.

In the first operating mode a), no frequency differences can arise. Thus, there can be no disturbing intermodulations and no audible effects.

In the second operating mode b), the frequencies are very close to one another in operation. Advantageously, the frequency difference is 500 Hz or less. Although a certain intermodulation arises from the set frequencies or operating frequencies of the induction coils, they are scarcely perceptible due to the very small frequency differences and because they are in a human audio range in which the average human ear is relatively insensitive.

In the third operating mode c), the frequency difference is in a very high audio range of the human ear, or above the audible range. Within the scope of the invention, it has additionally been found that with a frequency difference of approximately 18 kHz, and also 24 kHz, a particularly good suppression of audible noise is possible.

Thus, three possibilities are available for jointly operating several induction coils without them being disturbingly heard. These three operating modes can be advantageously used so that both the average power for each individual induction coil, and also the total average power, corresponds to a power stage selected by an operator. If this is possible through a constant operation with one of the operating modes a) or b), i.e., with a fixed and unchanged frequency, then this constitutes an advantageously selected operating procedure for several induction coils.

Advantageously, with this method precisely two induction coils can be operated as described in the present application. The possible variation of the operating frequencies and the setting of a specific frequency difference are particularly satisfactorily and predetermined possible.

It is possible for each induction hotplate to have a single induction coil. Alternatively, an induction hotplate can have an induction coil comprising several partial coils and/or which is controllable by several power generators or frequency converters. This corresponds to so-called multi-circuit heaters, such as are known in connection with radiant heating equipment.

Induction coils, particularly for use in the domestic sector, such as in an induction oven or induction hob, are advantageously operated in a frequency range of approximately 16 kHz to 100 kHz.

An advantageous procedure using operating mode c) involves the induction coils at the start of operation, i.e., if several coils are to be operated, being initially operated with a high frequency or the highest operating frequency of the system, with the requisite values inputted by means of a control device by means of an operator for each induction coil. Particularly advantageously, this leads to the function as saucepan detection coils. This makes it possible to determine whether a cooking utensil suitable for heating by is located above an induction coil. Subsequently, and for the case that at least two induction coils are to be operated, the frequencies are lowered with the frequency converters. This takes place to such an extent that the total power of the induction coils corresponds to the total power of the requisite values for the individual power levels. As this still takes place at the same frequency, as a rule, i.e., in the case of different requisite values for the power P, one induction coil is operated with more power than required and the other with less. Otherwise operation could take place according to one of the operating modes a) or b).

This appropriate total power occurs with a common frequency $f_g$. The induction coil operated with increased power is then moved upwards by the frequency difference according to operating mode c). The other induction coils remain at the previously existing frequency. If the frequency difference is set in the manner required, subsequently all the induction coils are moved downwards in their operating frequency with a fixed maintained frequency difference Δf until the total power again corresponds to the requisite value.

This can be followed by a cyclic or alternating operation of the induction coils if there is no change to the requisite values. This operation is such that operation takes place with the common frequency $f_g$ for a specific time $t_g$, which is calculated as follows:

$$t_g = \frac{\overline{P}_1 - P_1(f_{v1})}{P_1(f_g) - P_1(f_{v1})} = \frac{\overline{P}_2 - P_2(f_{v2})}{P_2(f_g) - P_2(f_{v2})}$$

or this is followed by an operation with the two different frequencies and the frequency difference Δf for the time $t_v$, $t_g+t_v=T$ and the operation alternates between these two modes.

If one of the requisite power values for one of the induction coils changes, then this method for determining the values for the frequencies and times is carried out again.

The sum of the powers at the common frequency $f_g$ corresponds to the sum of the powers at different frequencies and is at the same time identical to the requisite total power for both induction coils.

A flicker-free connection to a supply mains, or power source, is also possible with such an operation. However, if it is not possible to find a setting matching the requisite values with any of the aforementioned operating modes and where the frequency difference moves within the indicated framework, then in certain circumstances and for a certain time, operation with limited flicker is necessary or unavoidable. Restricting boundary conditions can be, for example, a minimum operating frequency of a frequency converter, a maximum permitted amplitude of the current in the frequency converter, a minimum permitted phase in a resonant circuit in the frequency converter, and also saturation effects in ferrites which are provided on the induction coils for influencing the magnetic field produced.

In a further possibility, an attempt is initially made to fulfil the conditions with a first lower frequency difference, for example 18 kHz. If this is not successful, or the intended algorithm is not appropriate for setting, an attempt can be made with a second, somewhat higher frequency difference of approximately 24 kHz.

These and further features can be gathered from the claims, description and drawings and the individual features, both singly or in the form of subcombinations, can be implemented in an embodiment of the invention and in other fields and can represent advantageous, independently protectable constructions for which protection is claimed here. The subdivision of the text into individual sections and the subheadings in no way restricts the general validity of the statements made thereunder.

FIG. 1 shows in section an induction hob 11. On a hotplate 13 is placed a control device 15 with two rotary toggles 16, 17 for setting the power. The representation of the control device 15 is highly diagrammatic and obviously all other control element types can be provided using, for example, contact switches.

Control device 15 is connected to a controller 18 and inter alia retransmits to the latter the control instructions by setting rotary toggles 16, 17. The controller 18 is, in turn, connected to a first frequency converter 19, which with a frequency $f_1$ supplies a first induction coil L1, as well as a second frequency converter 20, which with the frequency $f_2$ supplies a second induction coil L2.

Induction coils L1 and L2 are placed in known manner below hotplate 13. On their underside are provided ferrites 21 in known manner for influencing the magnetic field produced by induction coils L. Above the induction coils L1 and L2 cooking utensils 22, 23 are placed on hotplate 13. The larger cooking utensil 23 illustrates to what extent the coupling of a higher power is to take place or is desired. This can also be recognized from the position of rotary toggle 17, which is set further to the right and therefore to a higher power stage than the left-hand rotary toggle 16. Rotary toggle 16 is used for setting the power for the induction hot-plate formed by the left-hand induction coil L1 and the right-hand rotary toggle 17 for the induction hotplate formed by the right-hand induction coil L2.

Figure 2:
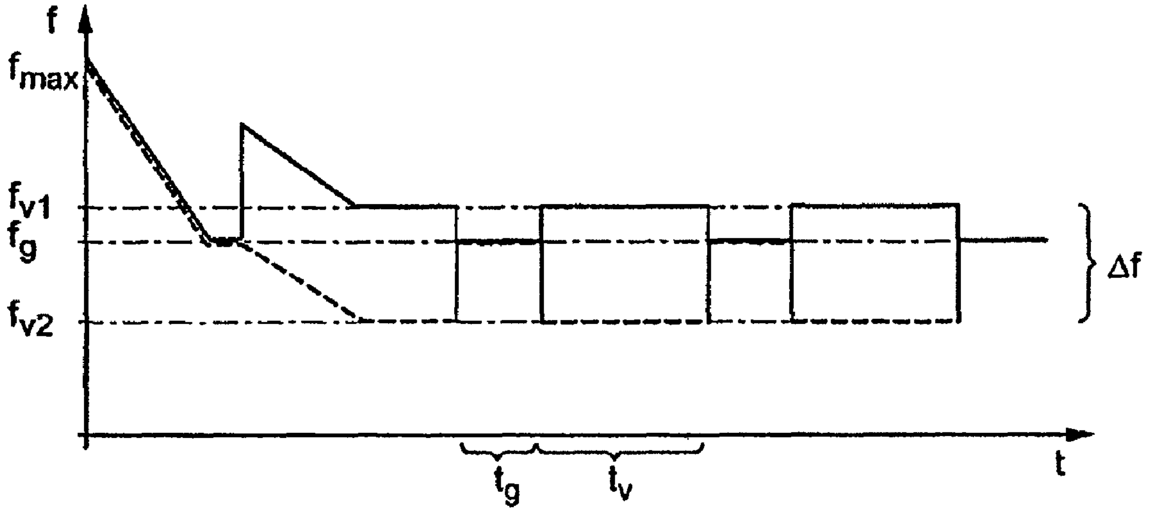
FIG. 2 illustrates a graph of two signals of an operating frequency f over time t associated with L1 and L2.
Figure 3:
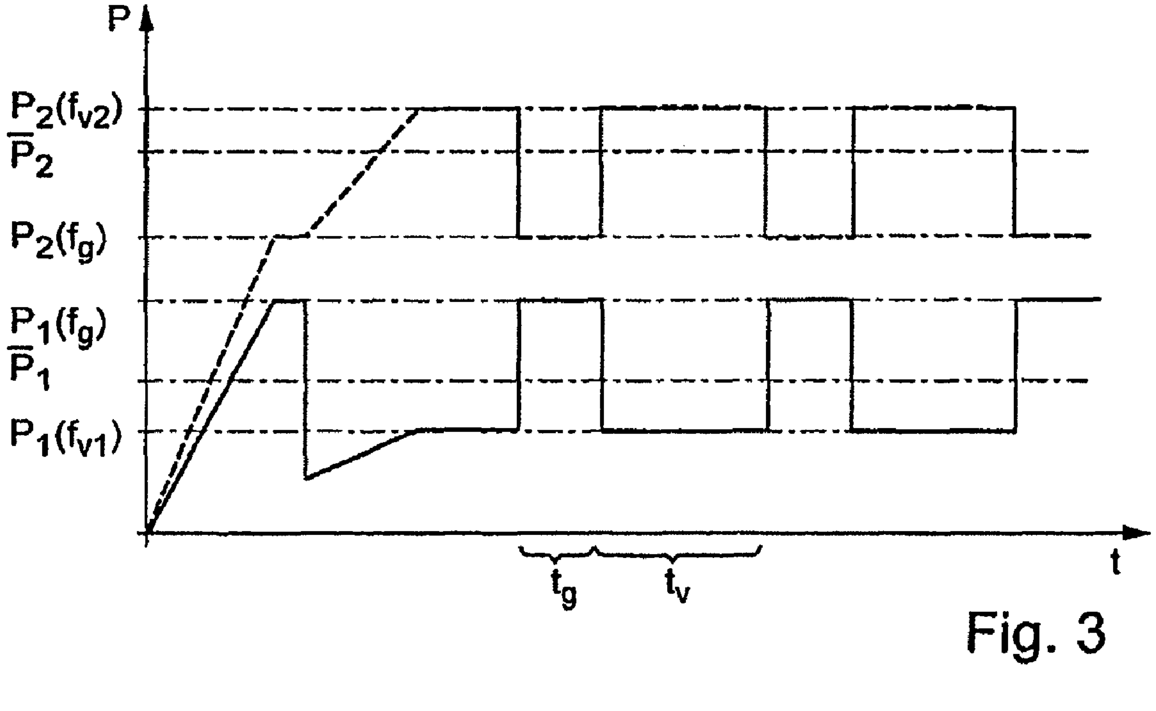
FIG. 3 illustrates a graph of the power P over time t.
Figure 2A:
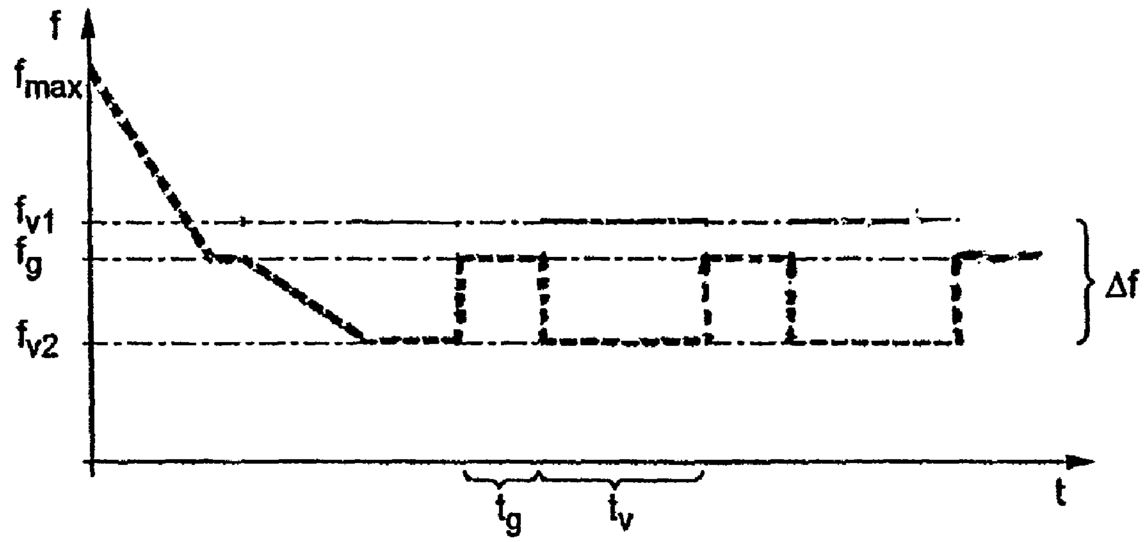
FIGS. 2A and 2B illustrate, for clarification, each signal associated with L1 and L2 individually of FIG. 2 over the same operating frequency f over time t.
Figure 2B:
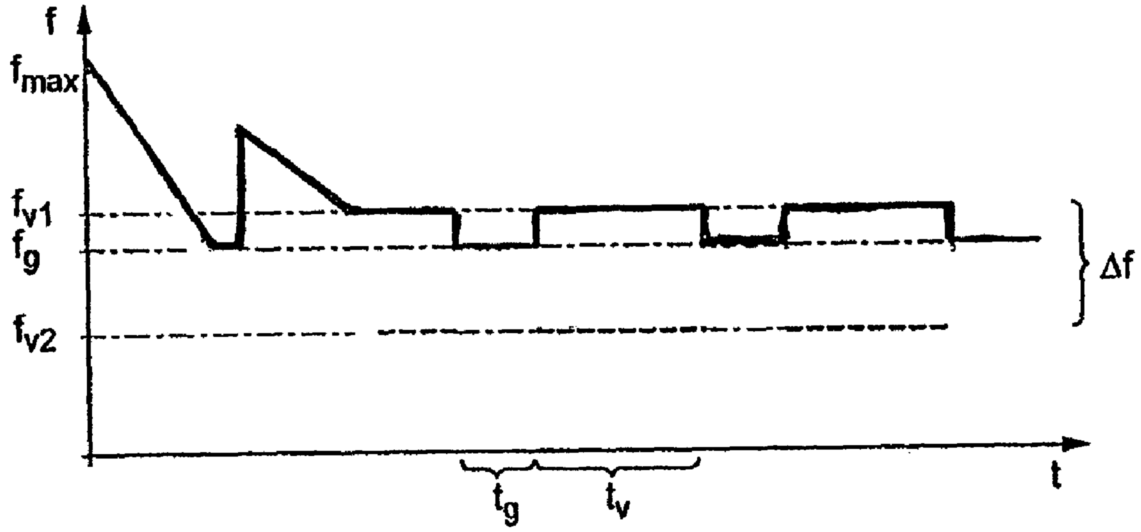

In FIGS. 2 and 3, which are jointly described hereinafter, it can be seen how induction coils L1 and L2 are supplied with power P at a specific supply voltage frequency. The paths for the frequency and power for coil L2 are shown in dotted line form. FIG. 2 illustrates two separate signals over time which are associated with L1 and L2 and which are superimposed on each other. These signals are separately illustrated in FIGS. 2A and 2B so as to clarify FIG. 2.

Operation starts with both induction coils L1 and L2 being operated with a common frequency, namely $f_{max}$ in order to accomplish a saucepan detection function. This is known to the expert and need not be further explained here. Regarding both induction coils L1 and L2, it is established in this embodiment that suitable cooking utensils, namely 22 and 23 have been placed on the cooktop and consequently operation is possible. This is followed by a power release by controller 18 and frequency converters 19 and 20.

The frequencies set by frequency converters 19 and 20 is then lowered with the same value to $f_g$, which results from indications that both induction coils L1 and L2 are to be operated with the same frequency $f_g$ and with the power levels $P_1(f_g)$ and $P_2(f_g)$. The powers $P_1(f_g)$ and $P_2(f_g)$ result from the presetting with $f_g$ and the predetermined value for the total power produced set using rotary toggles 16 and 17.

Detection takes place regarding the extent to which during the first operation with the common frequency $f_g$, induction coil L1 is operated with the power $P_1(f_g)$, which is higher than the average power $\overline{P}_1$ provided. Induction coil L2 is operated with power $P_2(f_g)$, which is below the average power $\overline{P}_2$ provided. Then the induction coil L1 operated with increased power with respect to its operating frequency $f_1$ is raised by a frequency difference Δf, which is in the present case 18 kHz. As a function of this, both operating frequencies are lowered with the fixed frequency difference Δf. To the same extent, there is an increase in the power levels of induction coils L1 and L2. Lowering takes place until the frequencies $f_{v1}$ and $fv_2$ are reached with the power levels $P_1(f_v)$ and $P_2(f_v)$, and the sum of $P_1(f_v)$ and $P_2(f_v)$ correspond to the sum of $P_1(f_g)$ and $P_2(f_g)$.

Operation then takes place for a specific time $t_v$ with precisely these values for $f_{v1}$ and $fv_2$ or the resulting frequency difference Δf. This is followed by operation with the common frequency $f_g$, where the powers are $P_1(f_g)$ and $P_2(f_g)$, i.e., induction coil L1 is operated with increased power and induction coil L2 with reduced power. This time period $t_g$ is calculated according to the following formula:

$$t_g = \frac{\overline{P}_1 - P_1(f_{v1})}{P_1(f_g) - P_1(f_{v1})} = \frac{\overline{P}_2 - P_2(f_{v2})}{P_2(f_g) - P_2(f_{v2})}$$

Following said time $t_g$, for a time $t_v$ there is once again the aforementioned operation with frequencies $f_{v1}$ and $f_{v2}$, where $t_g + t_v = T$.

Operation alternates here for as long as the preset power values $\overline{P}_1$ and $\overline{P}_2$ for induction coils L1 and L2 are not changed by an operator and this applies to the calculated times $t_g$ and $t_v$.

Thus, here there is an operation with the aforementioned operating mode a) associated with the time period $t_g$, and operating mode c) associated with the time period $t_v$. During time $t_g$ there is no noise evolution, because working takes place with the same frequencies and consequently no intermodulations can occur.

During time $t_v$, the aforementioned frequency difference of 18 kHz occurs during operating mode c), which means a scarcely audible noise evolution.

Thus, as a result of the described, inventive method, it is possible to avoid or greatly reduce noise evolution and at the same time the induction heaters produce the requisite power, at least on average.

If during operation with alternating power levels shown in FIGS. 2 and 3, changes to the predefined values for power $\overline{P}_1$ and $\overline{P}_2$ of induction coils L occurs, for example due to adjustments of rotary toggles 16 or 17, the calculation and setting takes place anew and this is followed by one of the aforementioned operating states.

The invention claimed is:

1. A method for supplying power to a plurality of induction coils in an induction apparatus, each said induction coil having a respective frequency converter and being supplied with said power by means of said respective frequency converter operating at a given frequency, wherein during simultaneous operation of the plurality of said induction coils, said frequencies of said frequency converters are set as a function of said power provided with respect to a frequency difference between said frequencies according to one of the following operating modes:

a) said frequency difference is zero, b) said frequency difference is less than 1 kHz, or c) said frequency difference is between 15 kHz and 25 kHz, and wherein at a start of operation a first induction coil and a second induction coil are operated:

a) with said first induction and said second induction coil both starting at a first common frequency and decreasing from the first common frequency to a second common frequency wherein at said second common frequency operation results in:

1) a first power provided to said first induction coil that is greater than a subsequently provided first average power provided to said first induction coil, and 2) a second power provided to said second induction coil that is less than a subsequently provided second average second power provided to said second induction coil;

b) wherein subsequent to reaching said second common frequency, said induction coils are operated:

1) during a first time period wherein said first power of said first induction coil decreases to a level less than said first average power, and said second power of said second induction coil increases to a level greater than said second average power, and 2) during a second time period wherein said first power of said first induction coil increases to a level above said first average power, and said second power of said second induction coil decreases to a level less than said second average power.

2. The method according to claim 1, wherein two induction coils are operated according to one of said aforementioned operating modes a) to c).

3. The method according to claim 1, wherein a subsequently alternating operation of said induction coils takes place with either said aforementioned common frequency for a first specific time or with said aforementioned frequency difference for a second specific time, said first specific time being equal to:

$$t_g = \frac{\overline{P}_1 - P_1(f_{v1})}{P_1(f_g) - P_1(f_{v1})} = \frac{\overline{P}_2 - P_2(f_{v2})}{P_2(f_g) - P_2(f_{v2})}.$$

4. The method according to claim 1, wherein said frequency difference for operating mode b) is a maximum of 500 Hz.

5. The method according to claim 1, wherein said frequency difference for operating mode c) is approximately 18 kHz.

6. The method according to claim 1, wherein said plurality of induction coils are operated in a frequency range of approximately 16 kHz to 100 kHz.

7. The method according to claim 6, wherein at said start of operation said induction coils are operated with a high frequency in a mode as saucepan detection coils.

8. A system for controlling an induction hob having at least two separately controllable induction coils comprising:

a first induction coil associated with a first frequency converter capable of being supplied with a first average power level;

a second induction coil associated with a second frequency converter capable of being supplied with a second average power level;

a power source supplying said first average power level and said second average power level;

a controller controlling said first frequency converter and said second frequency converter over a first time period wherein:

a) a first frequency of said first frequency converter results in a first power level of said first frequency converter, and b) a second frequency of said second frequency converter results in a second power level of said second frequency converter, said controller maintaining a frequency difference between said first frequency and said second frequency such that said frequency difference during said first time period is one of:

a) less than 1 khz, or b) between 15 kHz and 25 kHz, wherein said controller further controls said first frequency converter and said second frequency converter over a second time period wherein:

a) a third frequency of said first frequency converter results in a third power level of said first frequency converter that is different from said first power level, and b) a fourth frequency of said second frequency converter results in a fourth power level of said second frequency converter that is different from said second power level, wherein said second frequency difference between said third frequency and said second frequency is the other of:

a) less than 1 kHz, or b) between 15 kHz and 25 kHz.

9. The system of claim 8 wherein said first induction coil and said second induction coil are incorporated into a single hotplate element on the induction hob.

10. The system of claim 8 wherein said controller further maintains a) the frequency difference less than 1 kHz for the first time period, and wherein said third power level during the second time period is less than said first power level of said first time period, and b) the frequency difference between 15 kHz and 25 kHz for the second time period and wherein said fourth power level during said second time period is higher than said second power level of said first time period.

11. The system of claim 8 wherein said first induction coil and said second induction coil are respectively incorporated into a first hotplate element and a second hotplate element on the induction hob.

12. The system of claim 11 wherein the controller produces an average power over the first time period and the second time that is equal to the desired power level.

13. The system of claim 11 wherein the controller repeats the first time period and the second time period in sequence.

14. A controller for a hob having at least two separately controllable induction coils, performing the steps of:

controlling a first frequency converter of said hob associated with a first induction coil of said hob to supply a first power level ($P_1(f_{g1})$) to the first induction coil at a first frequency ($f_{g1}$) during a first time period ($t_g$);

controlling a second frequency converter of said hob associated with a second induction coil of said hob to supply a second power level ($P_2(f_{g2})$) to the second induction coil at a second frequency ($f_{g2}$) during said first time period ($t_g$);

controlling the first frequency converter to supply a third power level ($P_1(f_{v1})$) to the first induction coil at a third frequency ($f_{v1}$) during a second time period ($t_v$);

controlling the second frequency converter to supply a fourth power level ($P_2(f_2)$) to the second induction coil at a fourth frequency ($f_{v2}$) during the second time period ($t_v$), wherein a difference between the first frequency ($f_{g1}$) associated with the first induction coil and the second frequency ($f_{g2}$) associated with the second induction coil during the first time period ($t_g$) is less than 1 kHz, and a difference between the third frequency associated with the first induction coil ($f_{v1}$) and the fourth frequency ($f_{v2}$)associated with the second induction coil during the second time period ($t_v$) is between 15 kHz and 25 kHz.

15. The controller of claim 14 wherein the sum of the first power level and the second power level correspond to the sum of the third power level and the fourth power level.

* * * * *